(12) United States Patent
Yama et al.

(10) Patent No.: US 8,187,903 B2
(45) Date of Patent: May 29, 2012

(54) METHOD OF EPITAXIALLY GROWING PIEZORESISTORS

(75) Inventors: Gary Yama, Mountain View, CA (US);
Beth Pruitt, San Francisco, CA (US);
Arnoldus Alvin Barlian, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 281 days.

(21) Appl. No.: 12/353,080

(22) Filed: Jan. 13, 2009

(65) Prior Publication Data

US 2010/0176465 A1 Jul. 15, 2010

(51) Int. Cl.
*H01L 21/00* (2006.01)

(52) U.S. Cl. .......................................... 438/52; 438/50

(58) Field of Classification Search ............ 438/50, 438/52, 382

See application file for complete search history.

(56) References Cited

U.S. PATENT DOCUMENTS

| | | | |
|---|---|---|---|
| 5,500,078 A | 3/1996 | Lee | |
| 5,672,551 A | 9/1997 | Fung | |
| 5,856,967 A | 1/1999 | Mamin et al. | |
| 5,959,200 A | 9/1999 | Chui et al. | |
| 6,025,208 A * | 2/2000 | Chui et al. | 438/50 |
| 6,096,040 A | 8/2000 | Esser | |
| 6,140,143 A | 10/2000 | Christel et al. | |
| 6,278,167 B1 | 8/2001 | Bever et al. | |
| 6,389,899 B1 * | 5/2002 | Partridge et al. | 73/514.33 |
| 6,897,538 B2 | 5/2005 | Eskridge | |
| 6,991,957 B2 | 1/2006 | Eskridge | |
| 7,441,440 B2 * | 10/2008 | Sberveglieri et al. | 73/31.06 |
| 2004/0200281 A1 * | 10/2004 | Kenny et al. | 73/514.33 |
| 2005/0266599 A1 | 12/2005 | Ikegami | |
| 2008/0227234 A1 | 9/2008 | Yoshino | |

FOREIGN PATENT DOCUMENTS

| | | |
|---|---|---|
| EP | 1427010 | 6/2004 |
| WO | 0037912 | 6/2000 |
| WO | 03023414 | 3/2003 |

OTHER PUBLICATIONS

Jessica Arlett, Properties of piezoresistive silicon nano-scale cantilevers with applications to BioNEMS (2006) (unpublished Ph.D. dissertation, California Institute of Technology) (on file with author) (8 pages).
Gwiy-Sang Chung, Fabrication and Characteristics of Si Piezoresistive Micropressure Sensors for Tactile Imaging Devices (2006), Journal of the Korean Physical Society, vol. 49, No. 1, Jul. 2006, pp. 37-41 (5 pages).
International Search Report in corresponding PCT application (i.e., PCT/US2010/020750), mailed Apr. 13, 2010 (4 pages).

* cited by examiner

*Primary Examiner* — Bradley K Smith
(74) *Attorney, Agent, or Firm* — Maginot, Moore & Beck

(57) ABSTRACT

A method of forming a device with a piezoresistor is disclosed herein. In one embodiment, the method includes providing a substrate, etching a trench in the substrate to form a vertical wall, growing a piezoresistor layer epitaxially on the vertical wall, and separating the vertical wall from an underlying layer of the substrate that extends along a horizontal plane such that the piezoresistor layer is movable with respect to the underlying layer within the horizontal plane.

20 Claims, 8 Drawing Sheets

METHOD OF EPITAXIALLY GROWING PIEZORESISTORS

FEDERALLY-SPONSORED RESEARCH OR DEVELOPMENT

This invention was made with Government support under contract 0428889 awarded by the National Science Foundation. The Government has certain rights in this invention.

FIELD OF THE INVENTION

This invention relates to fabrication processes for semiconductor devices.

BACKGROUND

In the past, micro-electromechanical systems (MEMS) have proven to be effective solutions in various applications due to the sensitivity, spatial and temporal resolutions, and lower power requirements exhibited by MEMS devices. One such application is as an in-plane inertial sensor incorporating capacitive, optical, or piezoresistive technologies. Piezoresistors have been formed on the wall of sensing elements in such applications using ion implantation technologies. Implanted piezoresistors, however, suffer from increased noise levels, decreased sensitivity, and a higher thermal budget.

What is needed is a method of forming piezoresistors on the walls of sensing elements that provides piezoresistors exhibiting decreased noise levels. A further need exists for piezoresistors formed on the walls of sensing elements that exhibit good sensitivity and a low thermal budget.

SUMMARY

In accordance with one embodiment of the present invention, there is provided a method of forming a device with a piezoresistor that includes providing a substrate, etching a trench in the substrate to form a vertical wall, growing a piezoresistor layer epitaxially on the vertical wall, and separating the vertical wall from an underlying layer of the substrate that extends along a horizontal plane such that the piezoresistor layer is movable with respect to the underlying layer within the horizontal plane. Another embodiment would be to etch a trench into the substrate to form a vertical wall, oxidizing the exposed sidewall area, selectively removing the oxide along the vertical wall on the tether area, epitaxially growing a piezoresistor layer and separating the vertical wall from an underlying layer of the substrate. In accordance with another embodiment of the present invention, an in-plane accelerometer includes a silicon on insulator (SOI) substrate including a buried oxide layer located between a SOI handle layer and a SOI active layer, a trench extending from an upper surface of the substrate through the SOI active layer to a void area formed from the buried oxide layer, a tether formed from the SOI active layer, the tether extending above the void area and located between a first portion of the trench and a second portion of the trench, a first end portion of the tether in fixed relationship with the SOI handle layer, a second end portion of the tether movable within a plane parallel to the plane defined by the upper surface of the substrate, and a first piezoresistor epitaxially grown from the tether into the first portion of the trench. Another substrate that could be used is a bulk silicon substrate, which has a feature defining trench extending from the upper surface to the desired depth. In accordance with a further embodiment, a method of forming a piezoresistor device includes providing a silicon on insulator (SOI) substrate or a bulk silicon substrate, forming a first photomask on the upper surface of the SOI or silicon substrate, implanting conductive impurities in the upper surface of the SOI or silicon substrate through a window in the first photomask to form a first trace, forming a second photomask on the upper surface of the SOI or silicon substrate, etching a trench in the upper surface of the SOI or silicon substrate through an active layer of the SOI substrate to a buried oxide layer of the SOI substrate, or for the silicon substrate, to the desired depth, forming at least one piezoresistor epitaxially on a portion of the active layer exposed by the trench etching, and removing a portion of the buried oxide layer located beneath the portion of the active layer exposed by the trench etching. For the silicon substrate, removing a portion of the silicon from the backside directly beneath the tether and proof mass. This can be done using either dry etching or wet etching. The piezoresistor device also can be formed after the structure is released.

DESCRIPTION

Figure 1:
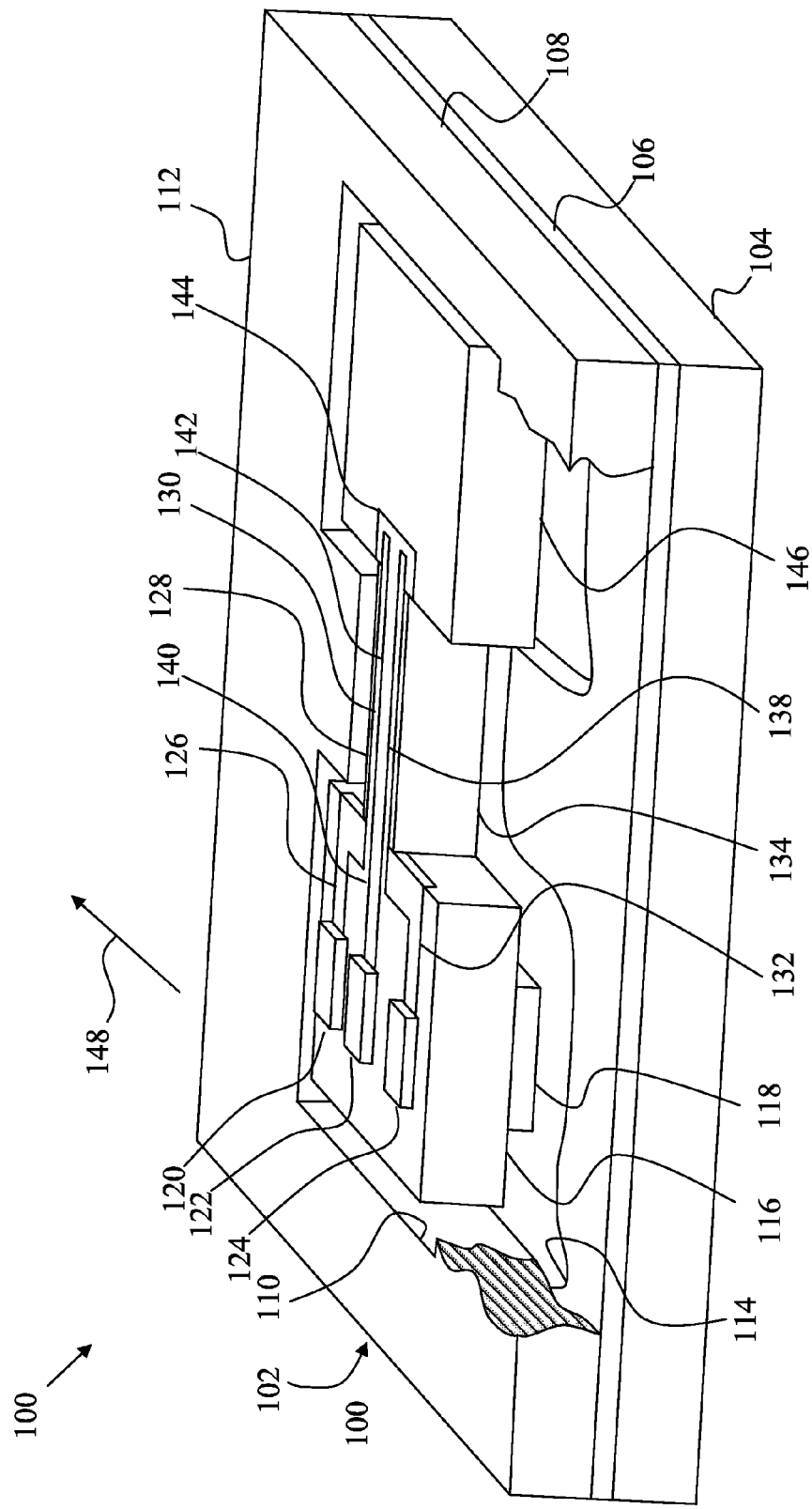
FIG. 1 depicts a perspective view of an accelerometer device with epitaxially grown piezoresistors in accordance with principles of the present invention.

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one skilled in the art to which this invention pertains.

FIG. 1 depicts a perspective view of an accelerometer device 100. The device 100 is formed on a substrate 102, which, in this embodiment, is a silicon on insulator (SOI) substrate. The substrate 102 includes an SOI handle layer 104, a buried oxide layer 106 and an SOI active layer 108, which is shown partially cutaway for clarity of description.

A trench 110 extends from the upper surface 112 of the SOI active layer 108 to a void area 114 between the SOI handle layer 104 and the SOI active layer 108 formed by removal of portions of the buried oxide layer 106. The trench 110 circumscribes an anchor area 116, which is connected to the SOI handle layer 104 by a remnant 118 of the buried oxide layer 106.

Three contact pads 120, 122, and 124 are located on the upper surface of the anchor area 116. The contact pad 120, which in this embodiment is made of aluminum or could be another metal or conductive material, is in electrically conductive contact with a conductive trace 126 implanted or other conductive material such as metal or silicon in the SOI active layer 108. The conductive trace 126 is in turn in electrically conductive contact with a piezoresistive sensing element 128. The piezoresistive sensing element 128 extends along the length of a tether area (also referred to as a cantilever arm) 130, extending outwardly from one side of the tether area 130 into the trench 110.

Similarly, the contact pad 124 is in electrically conductive contact with a conductive trace 132 implanted or other conductive material such as metal or silicon in the SOI active layer 108. The conductive trace 132 is in turn in electrically conductive contact with a piezoresistive sensing element 134. The piezoresistive sensing element 134 extends along the length of a tether area 130, extending outwardly from the opposite side of the tether area 130 into the trench 110.

The contact pad 122 is in electrically conductive contact with a conductive trace 138 implanted or other conductive material such as metal or silicon in the SOI active layer 108. The conductive trace 138 includes an anchor portion 140 implanted or conductively doped or deposited in the anchor area 116. An extension portion 142 of the conductive trace extends across the tether area 130 to a base section 144. The base section 144 is implanted or conductively doped or deposited into a proof mass area 146 and is electrically conductively connected to the piezoresistive sensing element 128 and the piezoresistive sensing element 134.

In operation, the accelerometer device 100 is mounted to an object (not shown). When the object (not shown) accelerates in the direction of the arrow 148, the SOI handle layer 104, which is fixedly attached to the object (not shown), accelerates simultaneously with the object (not shown). The anchor area 116 is fixedly mounted on the SOI handle layer 104 through the remnant 118. Accordingly, the anchor area 116 also accelerates simultaneously with the object (not shown).

The proof mass area 146 and the tether area 130 are not fixedly mounted to the SOI handle layer 104. Rather, the proof mass area 146 and the tether area 130 are supported by the anchor area 116. Accordingly, as the anchor area 116 accelerates in the direction of the arrow 148, the tether flexes because of the inertia of the tether area 130 and the proof mass area 146. Flexure of the tether area 130 causes the piezoresistive sensing elements 128 and 134 to flex. The piezoresistive sensing elements 128 and 134 translate the mechanical movement of the flexure area into a resistance change.

The conductive traces 126, 132, and 138 provide a conductive path for the current which translates the resistance change in the piezoresistive sensing element into a change in voltage across the sensing elements 128 and 134, resulting in a voltage differential across the contact pads 120, 122 and 126. The resistance or voltage change may then be used to determine the acceleration of the object (not shown).

Figure 2:
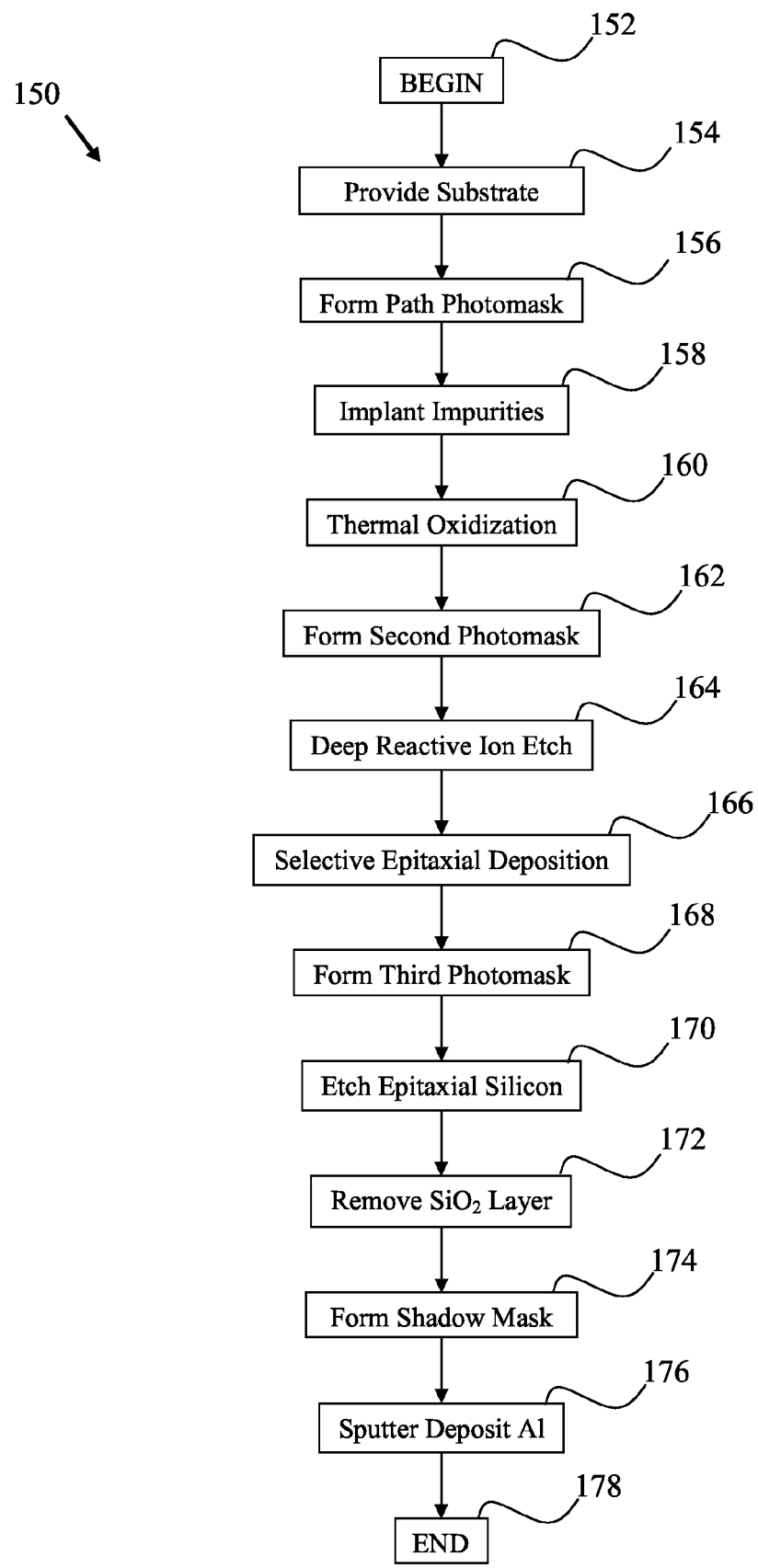
FIG. 2 depicts a flow chart of a process for manufacturing a device with epitaxially grown piezoresistors in accordance with principles of the present invention.

FIG. 2 shows a flow chart 150 of a manufacturing process that may be used to produce the accelerometer device 100. The process 150 of FIG. 2 begins (block 152) and a substrate is provided (block 154). A photomask defining low resistivity connection paths is then formed (block 156), followed by implantation of impurities to form the low resistivity paths (block 158). The implanted impurities are activated and a thin silicon dioxide layer is grown by thermal oxidation (block 160).

A second photomask which is used to define an anchor, a tether and a proof mass in the thin silicon dioxide layer is formed (block 162) after which a deep reactive ion etch is used to create a trench from the upper surface of the substrate to a buried oxide layer of the substrate to form the anchor, tether and proof mass areas (block 164). Doped epitaxial single crystal silicon is selectively deposited on the silicon area exposed by the deep reactive ion etch (block 166). A third photomask is formed to protect the piezoresistive epitaxial single crystal silicon on the side wall area of the tether (block 168) and unprotected piezoresistive epitaxial single crystal silicon is etched off (block 170). Portions of the buried oxide layer are removed to release the proof mass and tether (block 172). A shadow mask is formed to define electrical contact pad areas (block 174) and aluminum is sputter deposited to form electrical contact areas (block 176). The process then ends (block 178).

Figure 3:
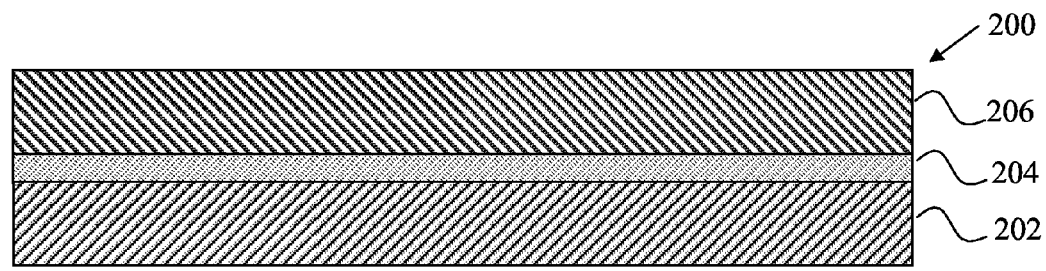
FIG. 3 depicts a cross-sectional view of a substrate, which in this embodiment is a silicon on insulator (SOI) substrate, which may be used in a device in accordance with principles of the present invention.
Figure 4:
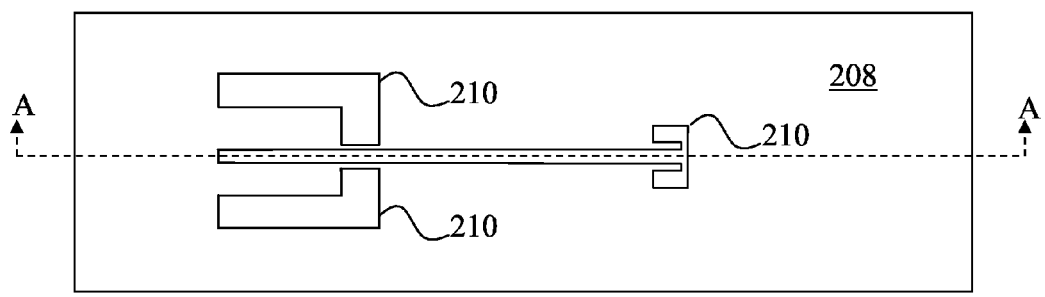
FIG. 4 depicts a top plan view of the substrate of FIG. 3 with a photomask including windows having the shape of conductive traces to be implanted into the upper surface of the substrate.
Figure 5:
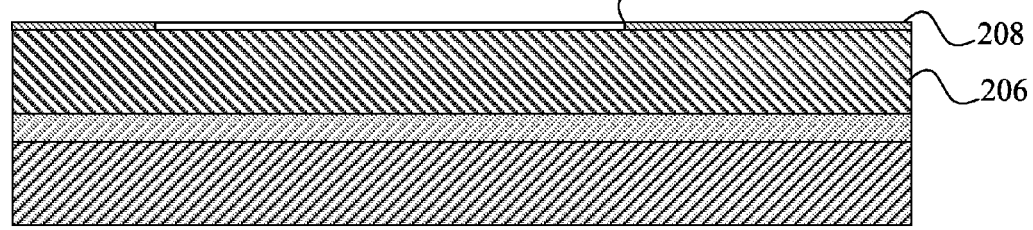
FIG. 5 depicts a cross sectional view of the substrate and photomask of FIG. 4 taken along the line A-A of FIG. 4.

One example of the process of FIG. 2 is shown in FIGS. 3-16. A substrate 200 is shown in FIG. 3. The substrate 200 in this embodiment is a silicon on insulator (SOI) substrate including an SOI handle layer 202, a buried silicon dioxide layer 204 and an active SOI layer 206. Next, a photomask 208 is formed on the exposed upper surface of the SOI active layer 206 as shown in FIGS. 4 and 5. The photomask 208 includes windows 210 through which the active layer 206 is exposed.

Figure 6:
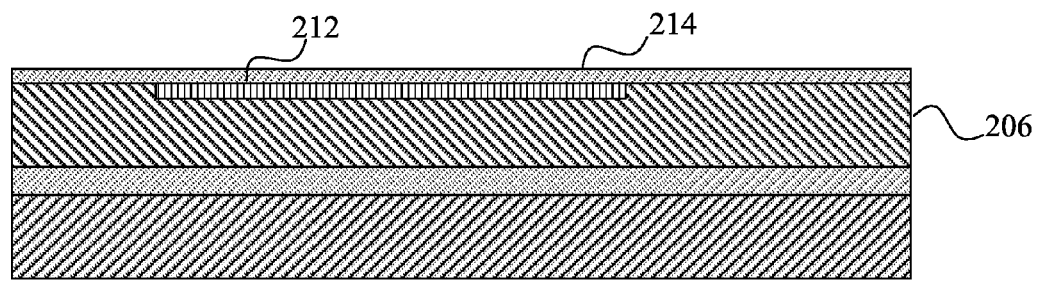
FIG. 6 depicts a cross sectional view of the substrate of FIG. 4 after impurities have been implanted and activated and a thin silicon oxide layer has been grown on the upper surface of the substrate.

Impurities are then implanted through the windows 210 into the active layer 206. Thermal oxidation is used to activate the impurities to form conductive traces 212 within the SOI active layer 206 and a thin silicon dioxide layer 214, which covers the conductive, traces 212 and the SOI active layer 206 as shown in FIG. 6.

Figure 7:
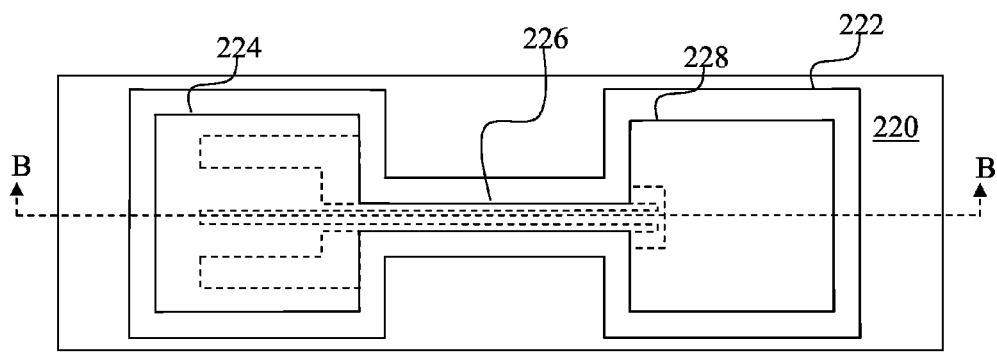
FIG. 7 depicts a top plan view of the substrate of FIG. 6 with a photomask including a window having the shape of a trench to be etched into the upper surface of the substrate.
Figure 8:
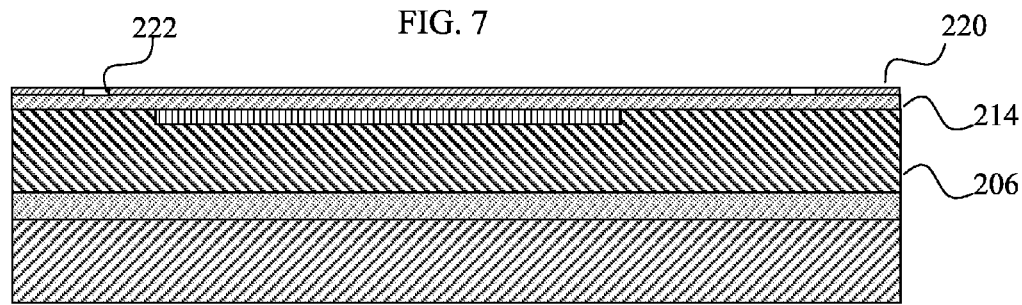
FIG. 8 depicts a cross sectional view of the substrate and photomask of FIG. 7 taken along the line B-B of FIG. 7.
Figure 9:
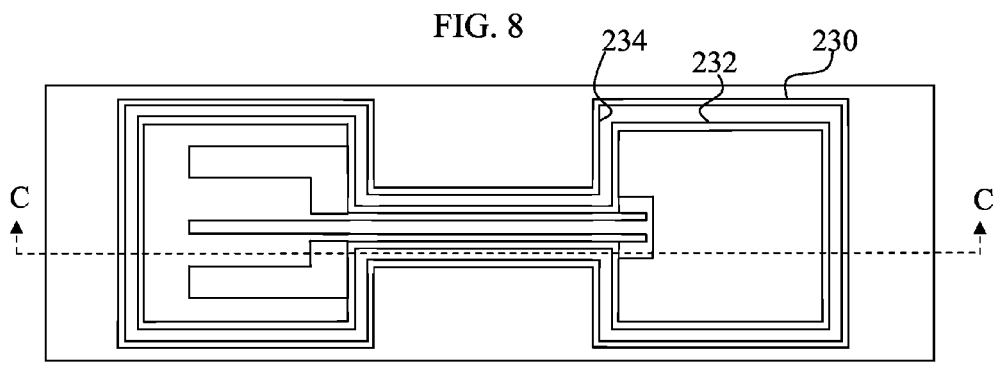
FIG. 9 depicts a top plan view of the substrate of FIG. 7 after a trench has been etched through the SOI active layer to the buried oxide layer and piezoresistive epitaxial single crystal silicon has been selectively deposited on the vertical walls of the SOI active layer exposed by the trench.
Figure 10:
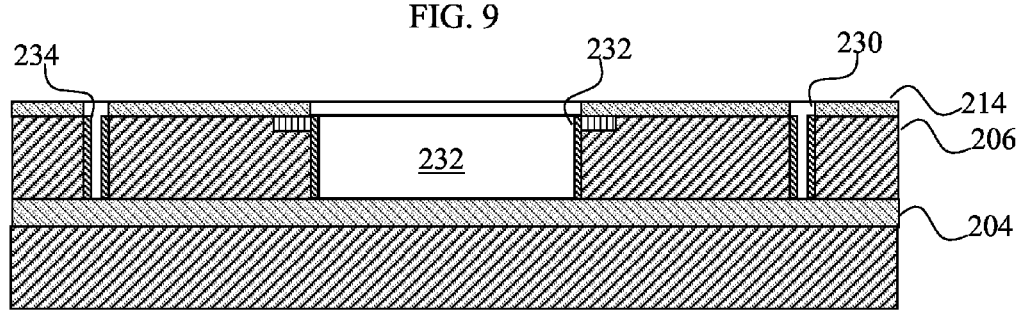
FIG. 10 depicts a cross sectional view of the substrate of FIG. 9 taken along the line C-C of FIG. 9.

Next, a photomask 220, shown in FIGS. 7 and 8, is formed on the silicon oxide layer 214. The photomask 220 includes a window 222, which defines a fixed anchor area 224, a tether area 226 and a proof mass area 228. A trench 230 (see FIGS. 9 and 10) is then formed in the portion of the silicon dioxide layer 214 that is exposed through the window 222, along with the portion of the SOI active layer 206 that is located directly below the exposed portion of the silicon dioxide layer 214 using a deep reactive ion etch process to expose the portion of the buried oxide layer 204 that is located directly below the exposed portion of the silicon dioxide layer 214. A selective single crystal silicon layer 232 is then epitaxially deposited on the inner vertical surfaces of the SOI active layer 206 that are exposed by the trench 230 as shown in FIGS. 9 and 10. The selective deposition of epitaxial silicon material also forms a single crystal silicon layer 234 on the outer vertical surfaces of the SOI active layer 206 that are exposed by the trench 230

Figure 11:
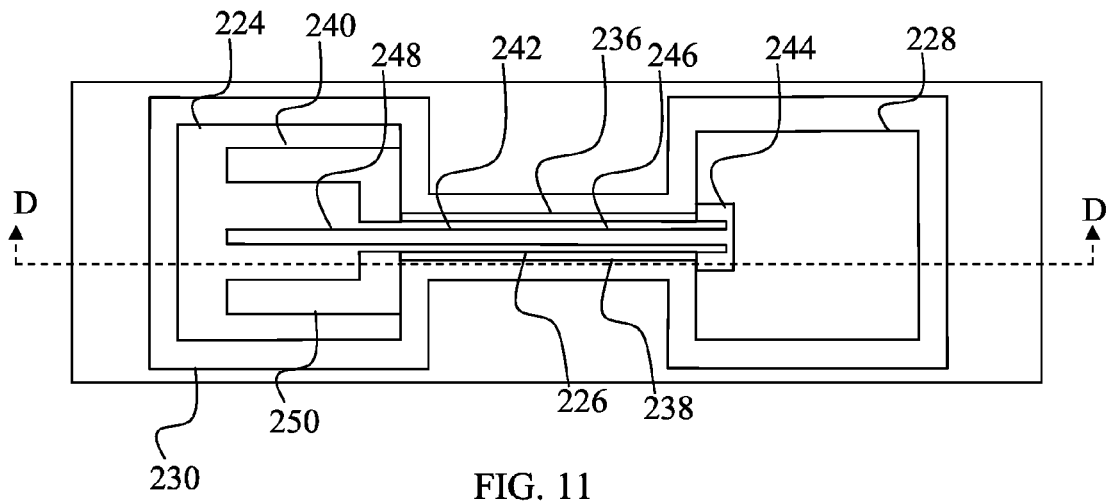
FIG. 11 depicts a top plan view of the substrate of FIG. 9 the piezoresistive epitaxial single crystal silicon layer has been etched leaving two piezoresistive sensing elements positioned on the side walls of a tether area.
Figure 12:
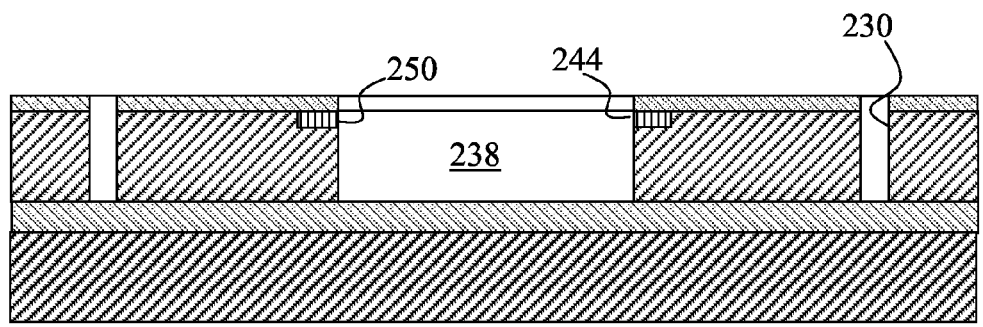
FIG. 12 depicts a cross sectional view of the substrate of FIG. 11 taken along the line D-D of FIG. 11.

Photolithography is then used to protect the portions of the single crystal silicon layer 232 adjacent to the tether area 226 and the remainder of the single crystal silicon layer 232 and the single crystal silicon layer 234 are etched. Thus, as shown in FIGS. 11 and 12, the single crystal silicon layer 234 within the trench 230 is completely removed and the single crystal silicon layer 232 is removed with the exception of sensing elements 236 and 238 adjacent the tether area 226.

The sensing element 236 is electrically conductively connected to two of the traces 212. Specifically, the sensing element 236 is conductively connected to an outer trace 240, which is located in the anchor area 224, and to an inner trace 242. The inner trace 242 includes a base portion 244 located in the proof mass area 228 to which the sensing element 236 is conductively connected, an extension portion 246 which extends along the tether area 226, and an end portion 248 located in the anchor area 224. The sensing element 238 is also conductively connected to the base portion 244. The sensing element 238 is further conductively connected to an outer trace 250.

Figure 13:
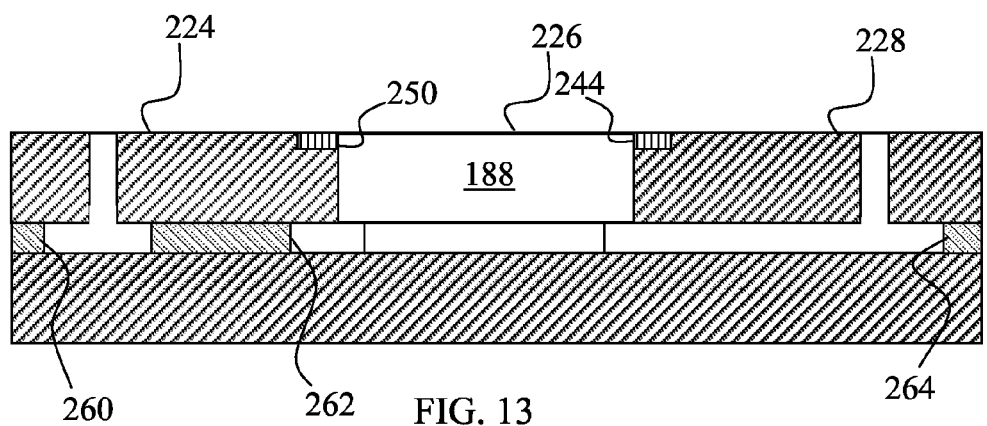
FIG. 13 depicts a cross sectional view of the substrate of FIG. 11 after vapor etching has been used to remove portions of the buried oxide layer to create a void underneath the tether area and proof mass area.

A vapor phase hydrofluoric acid is then introduced through the trenches 230 to remove portions of the buried oxide layer 204. The hydrofluoric acid etching creates void areas in the buried oxide layer 204 leaving the remnants 260, 262 and 264 as shown in FIG. 13. The remnant 262 supports the anchor area 224 on the SOI handle layer 202. The tether area 226 and the proof mass area 228, however, are released from the SOI handle layer 202 as a void area in the buried oxide layer 204 separates the tether area 226 and the proof mass area 228 from the SOI handle layer 202. Accordingly, the proof mass area 228 is supported by the tether area 226, which acts as a cantilever arm supported by the anchor area 224.

Figure 14:
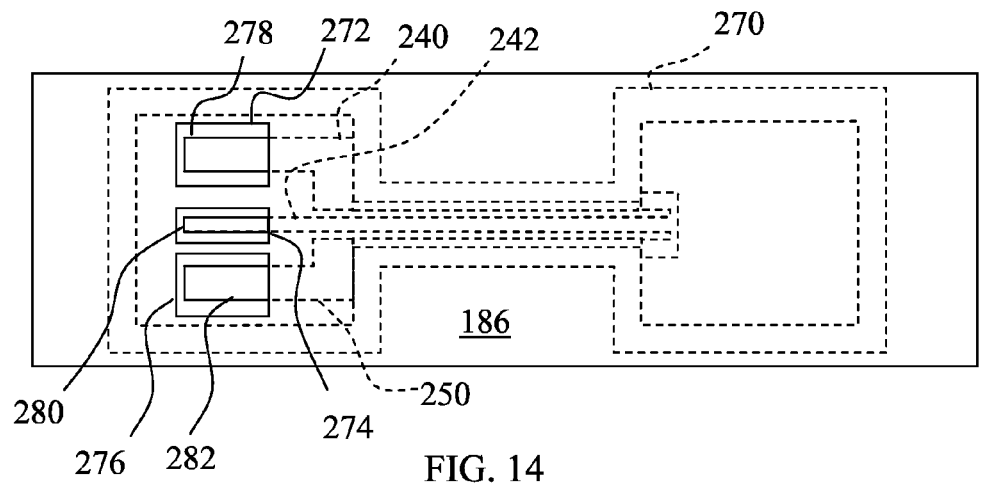
FIG. 14 depicts a top plan view of the substrate of FIG. 13 with a shadow mask including windows having the shape of a contact pads to be formed onto the upper surface of the substrate.
Figure 15:
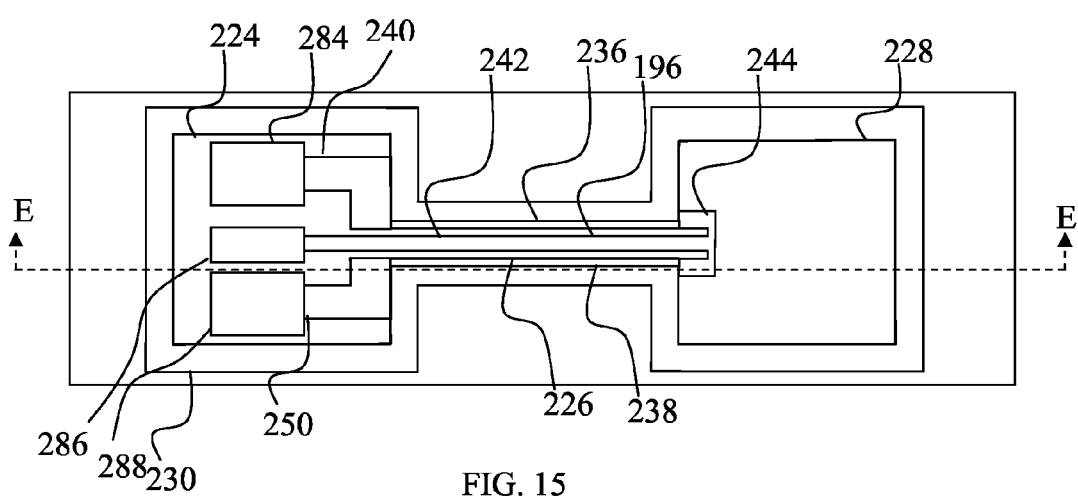
FIG. 15 depicts a top plan view of the substrate of FIG. 14 with contact pads formed onto the upper surface of the substrate in electrically conductive contact with conductive traces in the upper surface of the substrate.
Figure 16:
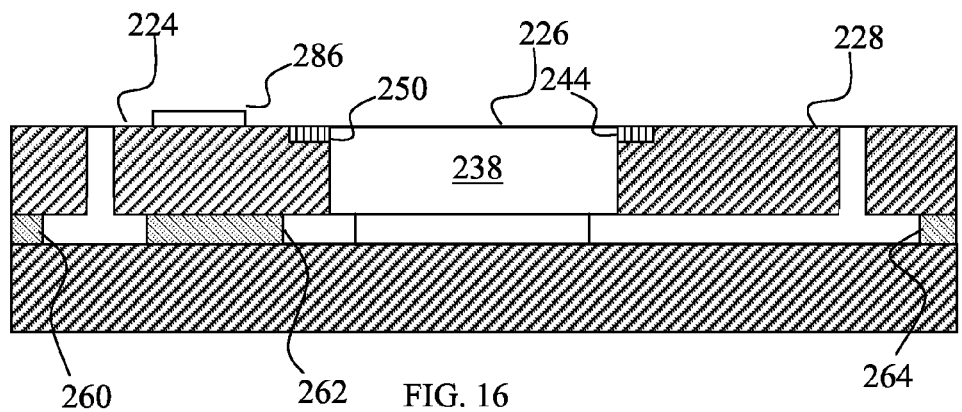
FIG. 16 depicts a cross sectional view of the substrate of FIG. 15 taken along the line E-E of FIG. 15.

A shadow mask 270, shown in FIG. 14, is formed on the SOI active layer 206. The shadow mask 270 includes windows 272, 274, and 276. Pad connection portions 278, 280, and 282 of outer trace 240, inner trace 242 and outer trace 250, respectively, are exposed though the windows 272, 274, and 276. Aluminum or could be another metal or conductive material is sputter deposited onto the pad connection portions 278, 280, and 282 to form contact pads 284, 286, and 288 shown in FIGS. 15 and 16.

Figure 17:
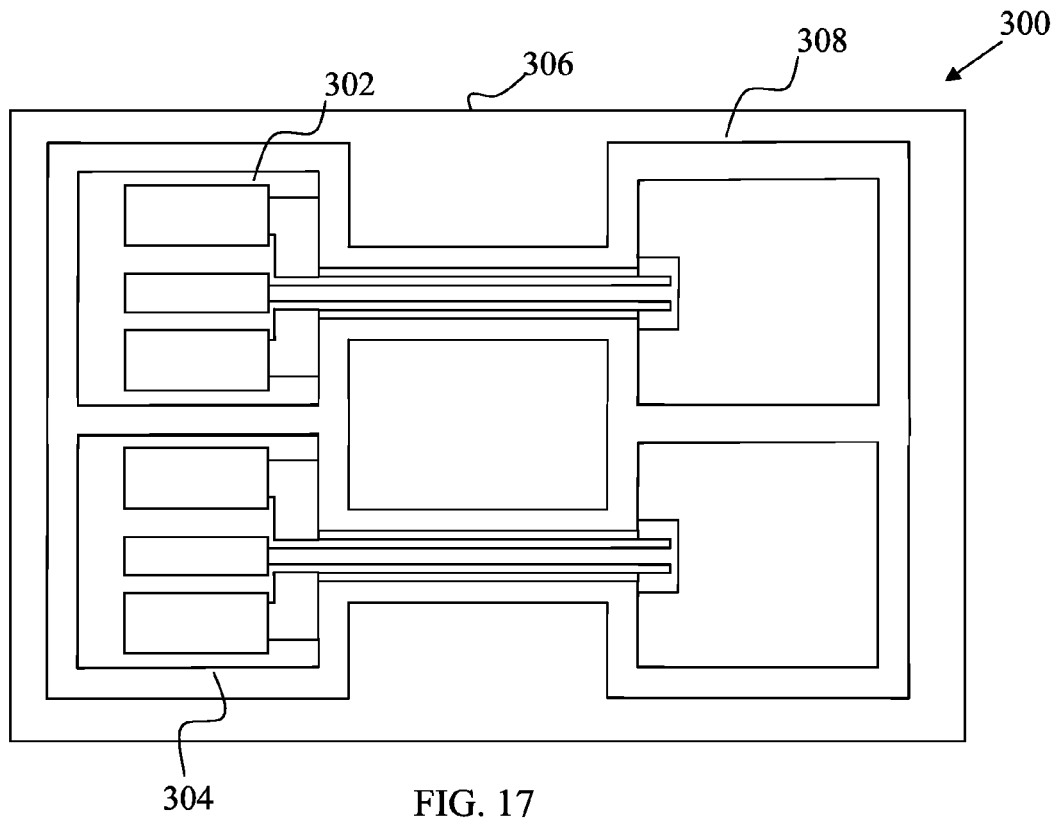
FIG. 17 depicts a top plan view of an alternatively configured device formed in accordance with principles of the present invention configured with two accelerometers.

The processes and devices described above may be modified in a number of ways to provide devices for different applications including, but not limited to inertial sensing, shear stress sensing, in-plane force sensing, etc. By way of example, the device 300 of FIG. 17 includes two accelerometers 302 and 304 on a single substrate 306. A single trench 308 defines both devices 302 and 304. Each of the devices 302 and 304 are made in the same manner as the accelerometer 100.

Figure 18:
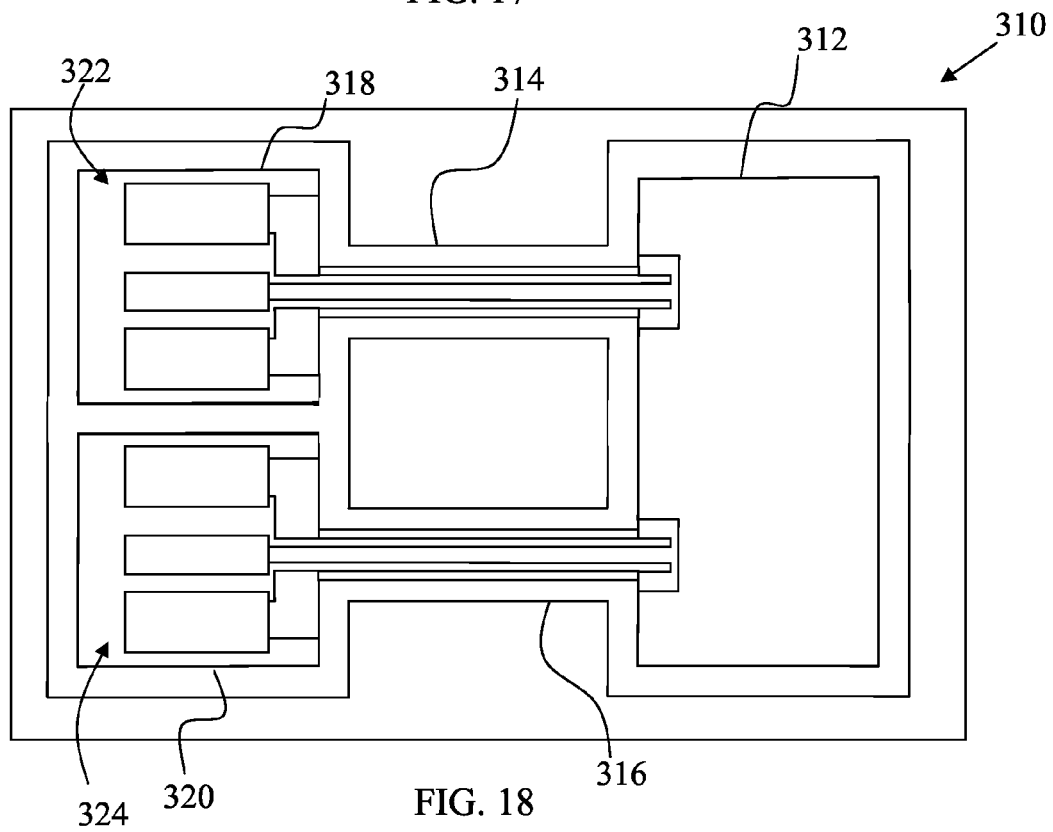
FIG. 18 depicts a top plan view of an alternatively configured device formed in accordance with principles of the present invention configured with two accelerometers sharing a common proof mass.

In a further embodiment, an accelerometer 310, shown in FIG. 18, includes a single proof mass 312. Two cantilever arms 314 and 316 extending from two anchor areas 318 and 320, respectively, support the proof mass 312. Each of the anchor areas 318 and 320 include a set of contact pads 322 and 324, respectively. The output from the contact pad sets 322 and 324 may be combined. Alternatively, one of the two cantilever arms 314 or 316 may be used as a primary sensor and the other of the two cantilever arms 314 or 316 used as a back-up sensor.

Figure 19:
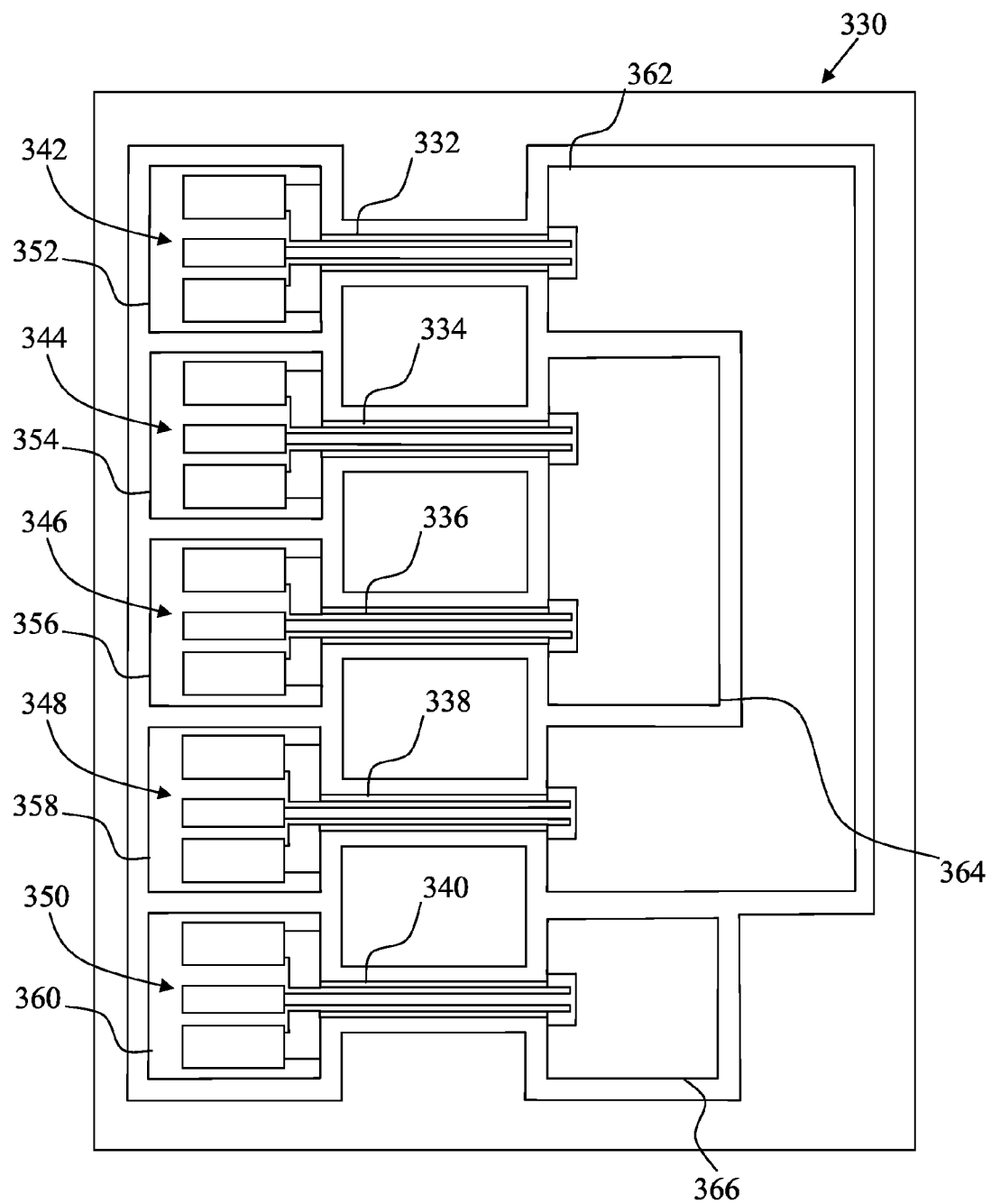
FIG. 19 depicts a top plan view of an alternatively configured device formed in accordance with principles of the present invention configured to provide three ranges of acceleration sensing.

Referring to FIG. 19, a multiple range accelerometer 330 is made in substantially the same manner as the accelerometer 100. The accelerometer 330, however, includes five cantilever arms 332, 334, 336, 338, and 340. Each of the cantilever arms 332, 334, 336, 338, and 340 are conductively connected to a respective set of contact pads 342, 344, 346, 348 or 350 located on a respective anchor area 352, 354, 356, 358 or 360.

The cantilever arms 332, 334, 336, 338, and 340 support three proof masses 362, 364 and 366. Specifically, the cantilever arms 332 and 338 support the proof mass 362, the cantilever arms 334 and 336 support the proof mass 364, and the cantilever arm 340 supports the proof mass 366. The proof mass 362 has the greatest mass of the proof masses 362, 364, and 366 while the proof mass 366 has the lowest mass.

Accordingly, while each of the cantilever arms 332, 334, 336, 338, and 340 are identical, the inertia of the proof mass 362 is greater than the inertia of the proof mass 364. Thus, when subjected to the same acceleration force, the cantilever arms 332 and 338 will bend more than the cantilever arms 334 and 336. Additionally, even though the proof mass 366 is supported by a single cantilever arm 340, the respective masses are selected such that each of the cantilever arms 332, 334, 336, and 338 will bend more than the cantilever arm 340. The device 330 thus provides an accelerometer, which can be wired to provide a high range output, a low range output and a medium range output.

The device 330 is further configured to provide increased sensitivity for the medium range acceleration force output and low range acceleration force output. Specifically, the output from the contact pad sets 342 and 348 may be combined to provide increased sensitivity for the low range output while the contact pad sets 344 and 346 may be combined to provide increased sensitivity for the medium range output.

In other embodiments, more piezoresistors are combined to provide an output for a device. In further embodiments, the cantilevers are not parallel. Additionally, the response characteristics of a device in accordance with principles of the invention may be modified in other ways. In addition to the use of a weight positioned on a cantilever arm, the dimensions of the cantilever itself along with the possibility of different materials used in forming the cantilever may be selected to provide desired properties. Another use of these unreleased devices could be a temperature compensation reference device.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

The invention claimed is:

1. A method of forming a device with a piezoresistor, comprising:
   providing a substrate;
   etching a trench in the substrate to form a vertical wall;
   growing a piezoresistor layer epitaxially on the vertical wall; and
   separating the vertical wall from an underlying layer of the substrate that extends along a horizontal plane such that the piezoresistor layer forms at least one piezoresistor on at least one non-piezoresistive portion of the substrate that is movable with respect to the underlying layer within the horizontal plane.

2. The method of claim 1, wherein etching a trench comprises:
   etching an active portion of a silicon on insulator (SOI) substrate to define an anchor area, a proof mass area, and a tether area extending between the anchor area and the proof mass area, the method further comprising:
   implanting a central conductive trace within the SOI substrate, the location of the implanted central conductive trace selected such that after the trench etching, the central conductive trace extends from the proof mass area along the tether area to the anchor area.

3. The method of claim 2, wherein growing a piezoresistor layer comprises:
   growing a first piezoresistor layer portion on a first vertical wall of the tether area; and
   growing a second piezoresistor layer portion on a second vertical wall of the tether area.

4. The method of claim 3, further comprising:
   implanting a first outer conductive trace within the SOI substrate, the location of the implanted first outer conductive trace selected such that growing a first piezoresistor layer portion comprises growing a first piezoresistor layer portion in electrically conductive contact with the first outer trace located in the anchor area; and
   implanting a second outer conductive trace within the SOI substrate, the location of the implanted second outer conductive trace selected such that growing a second piezoresistor layer portion comprises growing a second piezoresistor layer portion in electrically conductive contact with the second outer trace located in the anchor area.

5. The method of claim 4, further comprising:
   forming a first contact pad on a portion of the first outer conductive trace;
   forming a second contact pad on a portion of the second outer conductive trace; and
   forming a third contact pad on a portion of the central conductive trace.

6. The method of claim 3, wherein separating the vertical wall comprises:
   introducing a vapor etch into the trench;
   vapor etching the portion of a SOI buried oxide layer underlying the tether area; and
   vapor etching the portion of the SOI buried oxide layer underlying the proof mass area.

7. An in-plane accelerometer comprising:
   a silicon on insulator (SOI) substrate including a buried oxide layer located between a SOI handle layer and a SOI active layer;
   a trench extending from an upper surface of the substrate through the SOI active layer to a void area formed from the buried oxide layer;
   a tether formed from the SOI active layer, the tether extending above the void area and located between a first portion of the trench and a second portion of the trench;
   a first end portion of the tether in fixed relationship with the SOI handle layer;
   a second end portion of the tether movable within a plane parallel to the plane defined by the upper surface of the substrate; and
   a first piezoresistor epitaxially formed on at least one non-piezoresistive portion of the tether and adjacent to the first portion of the trench.

8. The in-plane accelerometer of claim 7, further comprising:
   a proof mass area formed from the SOI active layer, the proof mass area supported by the tether and extending above the void area and circumscribed by a third portion of the trench.

9. The in-plane accelerometer of claim 8, further comprising:
   an anchor area formed from the SOI active layer, the anchor area supporting the tether; and
   a first conductive trace implanted into the SOI active layer, the first conductive trace electrically coupled to a first end portion of the first piezoresistor and extending from the proof mass area to the anchor area.

10. The in-plane accelerometer of claim 9, further comprising:
    a second piezoresistor epitaxially grown on the tether adjacent to the second portion of the trench, a first end portion of the second piezoresistor electrically coupled to the first conductive trace;
    a second conductive trace located in the anchor area and electrically coupled to a second end portion of the first piezoresistor; and
    a third conductive trace located in the anchor area and electrically coupled to a second end portion of the second piezoresistor.

11. The in-plane accelerometer of claim 10, further comprising:
    a first contact pad electrically coupled to the first piezoresistor;
    a second contact pad electrically coupled to the second piezoresistor; and
    a third contact pad electrically coupled to the first conductive trace.

12. A method of forming a piezoresistor device, comprising:
    providing a silicon on insulator (SOI) substrate;
    forming a first photomask on the upper surface of the SOI substrate;
    implanting conductive impurities in the upper surface of the SOI substrate through a window in the first photomask to form a first trace;
    forming a second photomask on the upper surface of the SOI substrate;
    etching a trench in the upper surface of the SOI substrate through an active layer of the SOI substrate to expose a first portion of a buried oxide layer of the SOI substrate;
    forming at least one piezoresistor epitaxially on a portion of the active layer exposed by the trench etching;
    removing the first portion of the buried oxide layer through the trench; and
    removing a second portion of the buried oxide layer located beneath the portion of the active layer exposed by the trench etching.

13. The method of claim 12, further comprising:
   activating the implanted conductive impurities; and
   forming a thin silicon dioxide layer on the upper surface of the SOI substrate.

14. The method of claim 12, wherein forming at least one piezoresistor comprises:
   forming a piezoresistor layer on the portion of the active layer exposed by the trench etching;
   forming a third photomask on a portion of the piezoresistor layer; and
   etching the unmasked portion of the piezoresistor layer.

15. The method of claim 12, further comprising:
   forming a shadow mask on the upper surface of the substrate; and
   sputter depositing a contact pad on the upper surface of the SOI substrate through a window in the shadow mask.

16. The method of claim 12, further comprising:
   removing a third portion of the buried oxide layer located beneath a proof mass area.

17. The method of claim 12, wherein removing the first portion of the buried oxide layer comprises:
   vapor etching the first portion of the buried oxide layer through the trench.

18. The method of claim 12, wherein forming at least one piezoresistor comprises:
   forming a first piezoresistor; and
   electrically coupling the first piezoresistor with the first trace.

19. The method of claim 18, wherein forming at least one piezoresistor further comprises:
   forming a second piezoresistor;
   electrically coupling the second piezoresistor with the first trace;
   electrically coupling the first piezoresistor with a second trace; and
   electrically coupling the second piezoresistor with a third trace.

20. The method of claim 19, further comprising:
   forming a first contact pad in electrical communication with the first trace;
   forming a second contact pad in electrical communication with the second trace; and
   forming a third contact pad in electrical communication with the third trace.

* * * * *